United States Patent
Hsu et al.

(10) Patent No.: US 10,103,034 B2
(45) Date of Patent: Oct. 16, 2018

(54) METHOD OF PLANARIZING SUBSTRATE SURFACE

(71) Applicant: UNITED MICROELECTRONICS CORP., Hsin-Chu (TW)

(72) Inventors: Li-Chieh Hsu, Taichung (TW); Fu-Shou Tsai, Keelung (TW); Yu-Ting Li, Chiayi (TW); Yi-Liang Liu, Tainan (TW); Kun-Ju Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/678,134

(22) Filed: Aug. 16, 2017

(65) Prior Publication Data

US 2018/0012772 A1 Jan. 11, 2018

Related U.S. Application Data

(62) Division of application No. 15/201,628, filed on Jul. 5, 2016, now Pat. No. 9,773,682.

(51) Int. Cl.
*H01L 21/3105* (2006.01)
*H01L 29/06* (2006.01)
*H01L 29/78* (2006.01)

(52) U.S. Cl.
CPC .... *H01L 21/31053* (2013.01); *H01L 29/0653* (2013.01); *H01L 29/7851* (2013.01)

(58) Field of Classification Search
None
See application file for complete search history.

(56) References Cited

U.S. PATENT DOCUMENTS

| | | | | |
|---|---|---|---|---|
| 5,516,729 A | * | 5/1996 | Dawson | H01L 21/31053 257/E21.244 |
| 5,560,802 A | * | 10/1996 | Chisholm | H01L 21/31053 257/E21.244 |
| 5,851,899 A | | 12/1998 | Weigand | |
| 5,923,993 A | | 7/1999 | Sahota | |
| 5,928,960 A | | 7/1999 | Greco | |
| 5,943,590 A | | 8/1999 | Wang | |
| 6,171,929 B1 | | 1/2001 | Yang | |
| 6,323,102 B1 | | 11/2001 | Horita | |
| 6,368,906 B1 | | 4/2002 | Shin | |
| 7,589,022 B2 | | 9/2009 | Kim | |
| 7,651,922 B2 | | 1/2010 | Matsuda | |
| 8,173,548 B2 | * | 5/2012 | Hung | G03F 7/0035 257/E21.206 |
| 8,367,534 B2 | | 2/2013 | Chen | |
| 9,466,484 B1 | * | 10/2016 | Li | H01L 21/31051 |

(Continued)

*Primary Examiner* — Allan Olsen
(74) *Attorney, Agent, or Firm* — Winston Hsu

(57) ABSTRACT

A method of planarizing a substrate surface is disclosed. A substrate having a major surface of a material layer is provided. The major surface of the material layer comprises a first region with relatively low removal rate and a second region of relatively high removal rate. A photoresist pattern is formed on the material layer. The photoresist pattern masks the second region, while exposes at least a portion of the first region. At least a portion of the material layer not covered by the photoresist pattern is etched away. A polish stop layer is deposited on the material layer. A cap layer is deposited on the polish stop layer. A chemical mechanical polishing (CMP) process is performed to polish the cap layer.

6 Claims, 15 Drawing Sheets

(56) References Cited

U.S. PATENT DOCUMENTS

| | | | |
|---|---|---|---|
| 9,673,053 B2* | 6/2017 | Lee | H01L 21/30625 |
| 9,773,682 B1* | 9/2017 | Hsu | H01L 21/31053 |
| 2006/0183323 A1* | 8/2006 | Rhodes | H01L 27/14603 |
| | | | 438/655 |
| 2008/0248649 A1 | 10/2008 | Adetutu | |
| 2010/0330790 A1 | 12/2010 | Hempel | |
| 2015/0162419 A1* | 6/2015 | Li | H01L 29/66545 |
| | | | 438/585 |
| 2015/0179660 A1 | 6/2015 | Yada | |
| 2016/0148816 A1 | 5/2016 | Lee | |
| 2017/0162396 A1* | 6/2017 | Tsai | H01L 21/28247 |
| 2017/0162402 A1* | 6/2017 | Tsai | H01L 21/3212 |

* cited by examiner

METHOD OF PLANARIZING SUBSTRATE SURFACE

CROSS REFERENCE TO RELATED APPLICATIONS

This application is a division of U.S. application Ser. No. 15/201,628 filed Jul. 5, 2016, which is included in its entirety herein by reference.

BACKGROUND OF THE INVENTION

1. Field of the Invention

The present invention relates to the field of semiconductor processing. More particularly, the present invention relates to a method of planarizing a substrate surface that is capable of improving amorphous-Si CMP loading and achieving high degree of planarity.

2. Description of the Prior Art

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface.

However, variation in pattern density causes difference of CMP removal rate between dense region and semi-dense region, resulting in poor within-die (WID) loading. Therefore, there is a need in this industry to provide an improved method of planarizing a substrate surface that is capable of improving the WID loading.

SUMMARY OF THE INVENTION

It is one object of the invention to provide an improved method of planarizing a substrate surface that is capable of improving amorphous-Si CMP loading and achieving high degree of planarity.

According to one aspect of the invention, a method of planarizing a substrate surface is disclosed. A substrate having a major surface of a material layer is provided. The major surface of the material layer comprises a first region with relatively low removal rate and a second region of relatively high removal rate. A photoresist pattern is formed on the major surface of the material layer. The photoresist pattern masks the second region of relatively high removal rate, while exposes at least a portion of the first region with relatively low removal rate. At least a portion of the material layer not covered by the photoresist pattern is etched away. The photoresist pattern is removed. A polish stop layer is deposited on the major surface of the material layer. A cap layer is deposited on the polish stop layer. A chemical mechanical polishing (CMP) process is performed to polish the cap layer. A dry etching process is performed to etch the cap layer, the polishing stop layer, and the material layer.

According to one embodiment, a method of planarizing a substrate surface is disclosed. A substrate having a major surface of a material layer is provided. The major surface of the material layer comprises a first region with relatively low removal rate and a second region of relatively high removal rate. A polish stop layer is deposited on the major surface of the material layer. A cap layer is deposited on the polish stop layer. A photoresist pattern is formed on the cap layer. The photoresist pattern masks the second region of relatively high removal rate, while exposes at least a portion of the first region with relatively low removal rate. At least a portion of the cap layer not covered by the photoresist pattern is etched away. The photoresist pattern is removed. A chemical mechanical polishing (CMP) process is performed to polish the cap layer. A dry etching process is performed to etch the cap layer, the polishing stop layer, and the material layer.

According to another embodiment, a method of planarizing a substrate surface is disclosed. A substrate having a major surface of a material layer is provided. The major surface of the material layer comprises a first region with relatively low removal rate and a second region of relatively high removal rate. A polish stop layer is deposited on the major surface of the material layer. A cap layer is deposited on the polish stop layer. A chemical mechanical polishing (CMP) process is performed to polish the cap layer. A photoresist pattern is formed on the cap layer. The photoresist pattern masks the second region of relatively high removal rate, while exposes at least a portion of the first region with relatively low removal rate. At least a portion of the cap layer not covered by the photoresist pattern is etched away. The photoresist pattern is removed. A dry etching process is performed to etch the cap layer, the polishing stop layer, and the material layer.

According to another embodiment, a method of planarizing a substrate surface is disclosed. A substrate having a major surface of a material layer is provided. The major surface of the material layer comprises a first region with relatively low removal rate and a second region of relatively high removal rate. A polish stop layer is deposited on the major surface of the material layer. A photoresist pattern is formed on the polish stop layer. The photoresist pattern masks the second region of relatively high removal rate, while exposes at least a portion of the first region with relatively low removal rate. At least a portion of the polish stop layer not covered by the photoresist pattern is etched away. The photoresist pattern is removed. A cap layer is deposited on the polish stop layer and on the material layer. A chemical mechanical polishing (CMP) process is performed to polish the cap layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
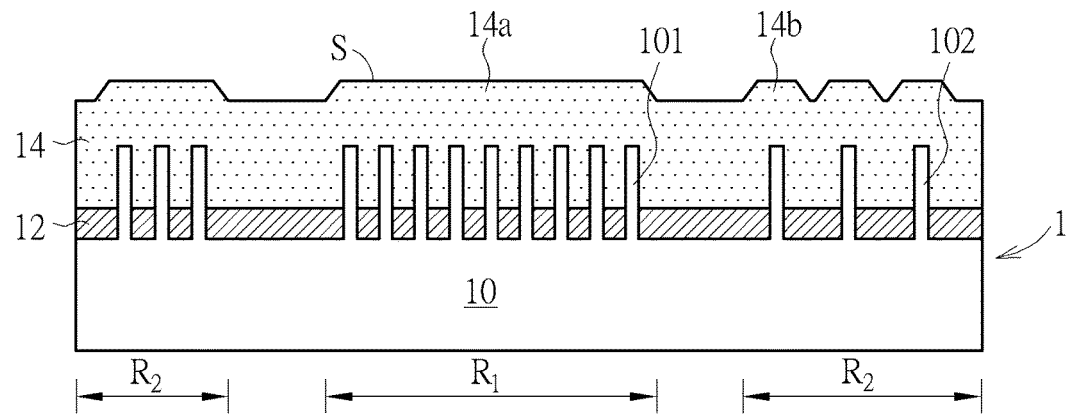
FIG. 1 to FIG. 6 are schematic, cross-sectional diagrams showing an exemplary method of planarizing a substrate surface in accordance with one embodiment of the invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The terms substrate used herein include any structure having an exposed surface onto which a layer may be deposited according to the present invention, for example, to form the integrated circuit (IC) structure. The term substrate is understood to include semiconductor wafers. The term substrate is also used to refer to semiconductor structures during processing, and may include other layers that have been fabricated thereupon. The term substrate may include doped and undoped semiconductors, epitaxial semiconductor layers supported by a base semiconductor or insulator, as well as other semiconductor structures well known to one skilled in the art.

Please refer to FIG. 1 to FIG. 6. FIG. 1 to FIG. 6 are schematic, cross-sectional diagrams showing an exemplary method of planarizing a substrate surface in accordance with one embodiment of the invention.

As shown in FIG. 1, a substrate 1 is provided. The substrate 1 may comprise a semiconductor bulk layer 10 such as a silicon layer, a silicon substrate, or the like. The semiconductor bulk layer 10 may have a pre-selected conductivity type, for example, P type or N type. According to various embodiments, the semiconductor bulk layer 10 may include, but not limited to, silicon, silicon-containing material, GaN-on-silicon (or other materials of Group III-V), grapheme-on-silicon or silicon-on-insulator (SOI), but is not limited thereto.

An isolation layer 12 may be formed on or in the semiconductor bulk layer 10. For example, the isolation layer 12 may comprise shallow trench isolation (STI).

According to the embodiment, the substrate 1 may further comprise a plurality of fin structures 101 and 102, which may be integrally formed with the semiconductor bulk layer 10 and may protrude from a top surface of the isolation layer 12. According to the embodiment, the fin structures 101 are arranged in the first region $R_1$ and the fin structures 102 are arranged in the second region $R_2$. The first region $R_1$ and the second region $R_2$ may be two spaced-apart, non-overlapping regions.

According to the embodiment, the fin structures 101 are more densely packed than the fin structures 102. A material layer 14 such as an amorphous silicon layer may be deposited on the fin structures 101 and 102 and on the isolation layer 12.

The fin structures 101 and 102 are covered with the material layer 14. According to the embodiment, the material layer 14 has a major surface S with a topography including a large bump 14a in the first region $R_1$ and several small bumps 14b in the second region $R_2$. According to the embodiment, the material layer 14 has a relatively lower removal rate in the first region $R_1$ than that in the second region $R_2$ during a chemical mechanical polishing (CMP) process due to the topography of the major surface S.

Figure 2:
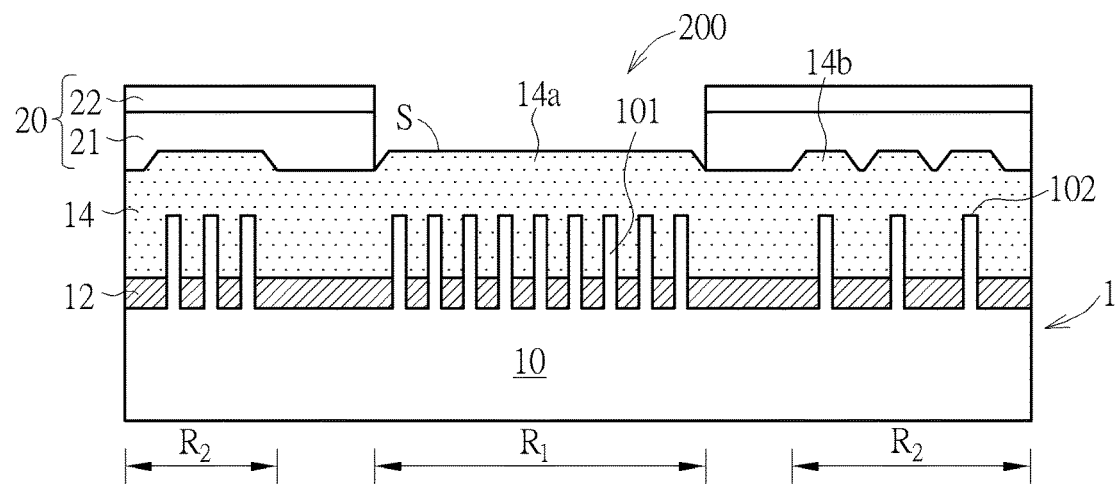

As shown in FIG. 2, a mask layer 20 including a hard mask 21 and a photoresist pattern 22 is formed on the major surface S of the material layer 14. An opening 200 is formed in the mask layer 20 to expose the material layer 14 in the first region $R_1$. The second region $R_2$ is covered with the mask layer 20. According to the embodiment, the large bump 14a in the first region $R_1$ is exposed in the opening 200.

Figure 3:
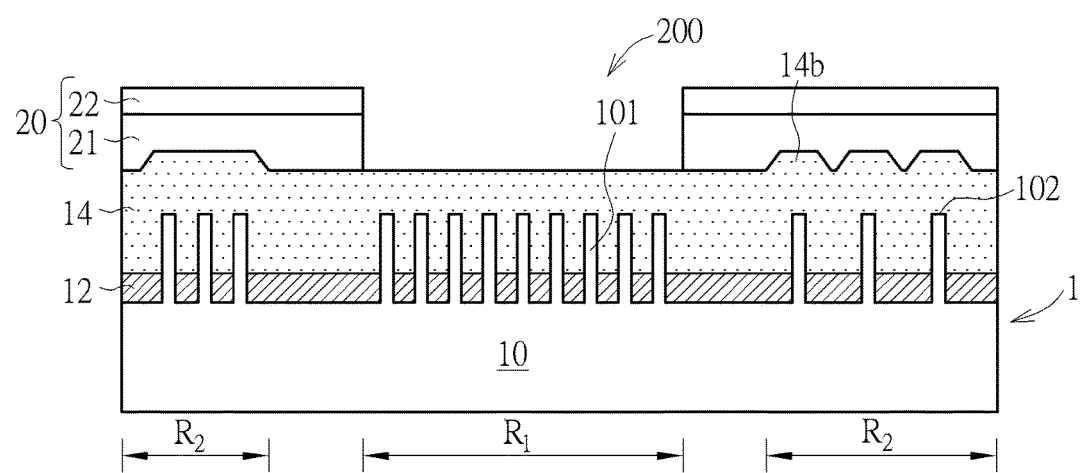

As shown in FIG. 3, using the photoresist pattern 22 and the hard mask 21 as an etching hard mask, an etching process is performed to remove at least a portion of the material layer 14 from the opening 200. Subsequently, the remaining mask layer 20 including the photoresist pattern 22 and the hard mask 21 is completely removed. At this point, the large bump 14a in the first region $R_1$ may be eliminated to thereby form a surface that is coplanar with or lower than the surface in the second region $R_2$.

Figure 4:
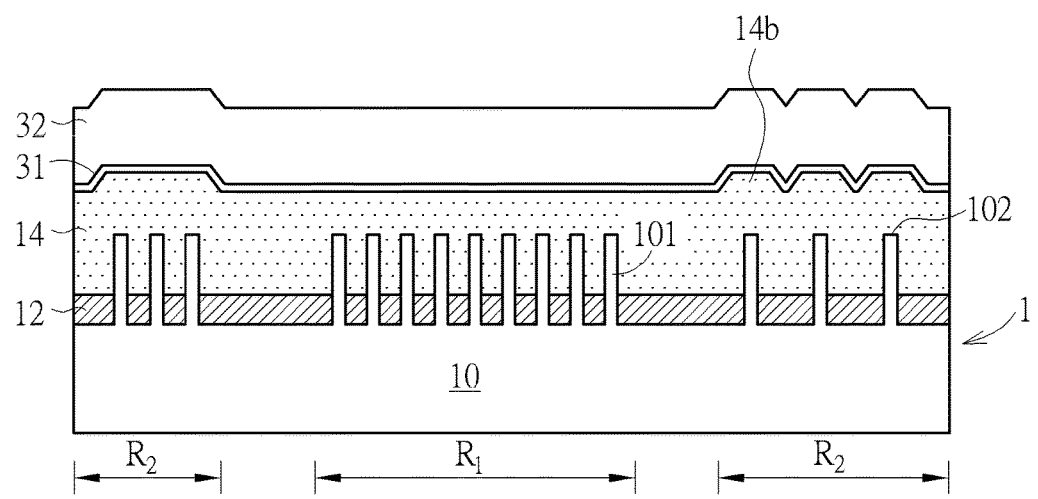

As shown in FIG. 4, after removing the mask layer 20, a polish stop layer 31 is conformally deposited on the major surface S of the material layer 14. According to the embodiment, the polish stop layer 31 may comprise silicon nitride, but is not limited thereto. Subsequently, a cap layer 32 is conformally deposited on the polish stop layer 31. According to the embodiment, the cap layer 32 may comprise silicon oxide or amorphous silicon. According to the embodiment, the cap layer 32 may have a topography that is similar to that of the major surface S of the material layer 14.

Figure 5:
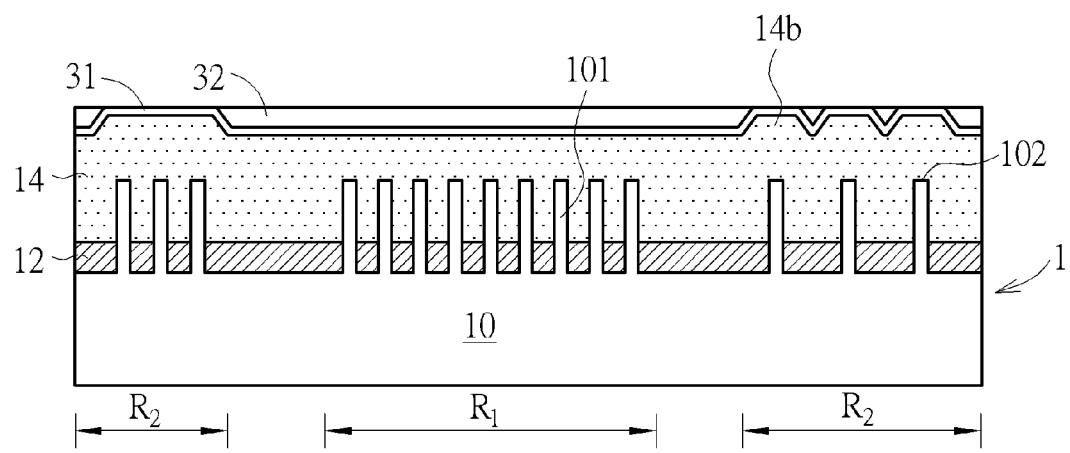

As shown in FIG. 5, after depositing the cap layer 32, a chemical mechanical polishing (CMP) process is performed to polish the cap layer 32. According to the embodiment, the CMP process stops on the polish stop layer 31. According to the embodiment, at the end point and upon the exposure of the polish stop layer 31, a portion of the cap layer 32 may remain in the first region $R_1$.

Figure 6:
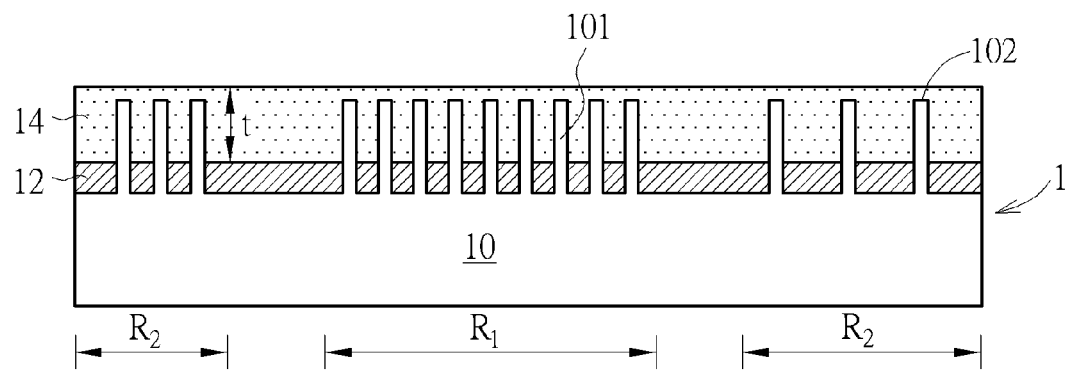

As shown in FIG. 6, a dry etching process is then performed to etch the remaining cap layer 32, the polishing stop layer 31, and the material layer 14 until a target thickness t of the material layer 14 is reached. According to the embodiment, the dry etching process is performed at a substantially same etching rate with respect to the cap layer 32, the polishing stop layer 31, and the material layer 14. According to the embodiment, after the dry etching process is completed, the material layer 14 has a flat major surface.

Please refer to FIG. 7 to FIG. 13. FIG. 7 to FIG. 13 are schematic, cross-sectional diagrams showing an exemplary method of planarizing a substrate surface in accordance with another embodiment of the invention.

Figure 7:
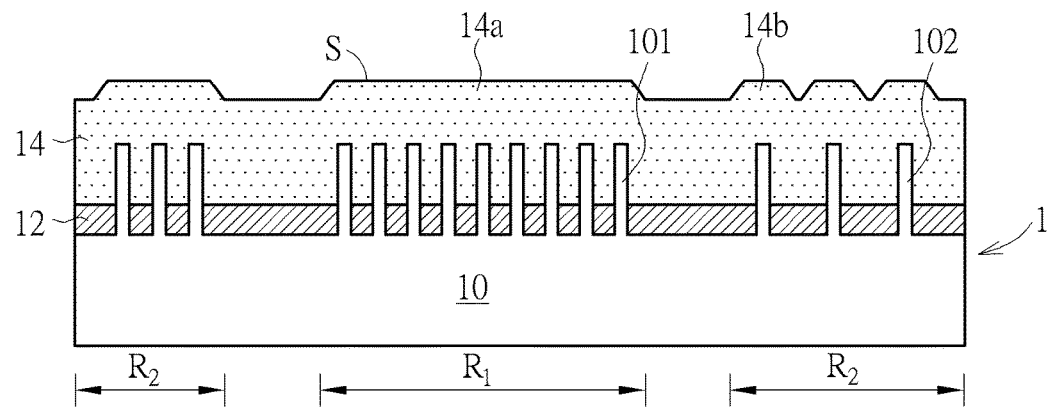
FIG. 7 to FIG. 13 are schematic, cross-sectional diagrams showing an exemplary method of planarizing a substrate surface in accordance with another embodiment of the invention.

As shown in FIG. 7, likewise, a substrate 1 is provided. The substrate 1 may comprise a semiconductor bulk layer 10 such as a silicon layer, a silicon substrate, or the like. An isolation layer 12 may be formed on or in the semiconductor bulk layer 10. For example, the isolation layer 12 may comprise shallow trench isolation (STI).

According to the embodiment, the substrate 1 may further comprise a plurality of fin structures 101 and 102, which may be integrally formed with the semiconductor bulk layer 10 and may protrude from a top surface of the isolation layer 12. According to the embodiment, the fin structures 101 are arranged in the first region $R_1$ and the fin structures 102 are arranged in the second region $R_2$. The first region $R_1$ and the second region $R_2$ may be two spaced-apart, non-overlapping regions.

According to the embodiment, the fin structures 101 are more densely packed than the fin structures 102. A material layer 14 such as an amorphous silicon layer may be deposited on the fin structures 101 and 102 and on the isolation layer 12.

The fin structures 101 and 102 are covered with the material layer 14. According to the embodiment, the material layer 14 has a major surface S with a topography including a large bump 14a in the first region $R_1$ and several small bumps 14b in the second region $R_2$. According to the embodiment, the material layer 14 has a relatively lower removal rate in the first region $R_1$ than that in the second region $R_2$ during a chemical mechanical polishing (CMP) process due to the topography of the major surface S.

Figure 8:
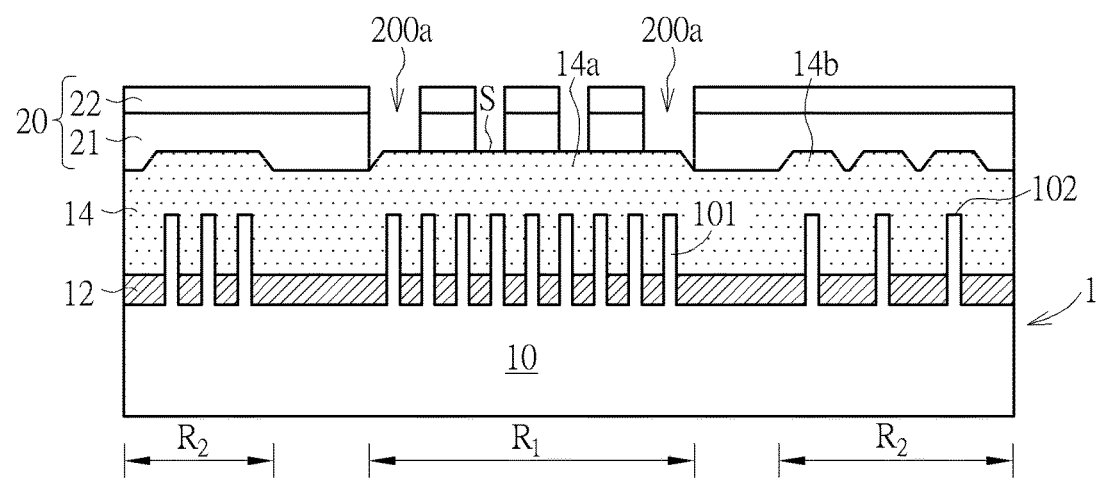

As shown in FIG. 8, a mask layer 20 including a hard mask 21 and a photoresist pattern 22 is formed on the major surface S of the material layer 14. A plurality of openings 200a is formed in the mask layer 20 to partially expose the material layer 14 in the first region $R_1$. The second region R2 is completely covered with the mask layer 20. According to the embodiment, the large bump 14a in the first region $R_1$ is partially exposed in the openings 200a.

Figure 9:
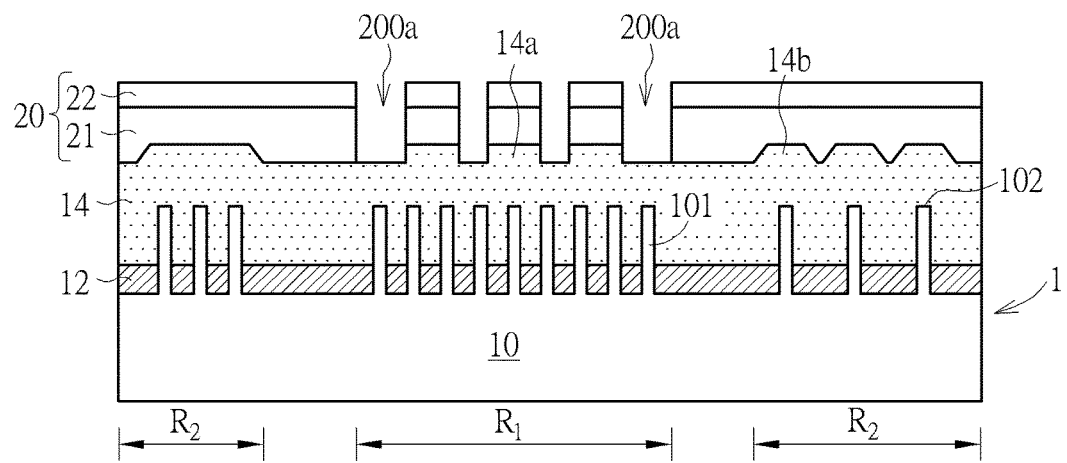

As shown in FIG. 9, using the photoresist pattern 22 and the hard mask 21 as an etching hard mask, an etching process is performed to remove at least a portion of the material layer through the openings 200a.

Figure 10:
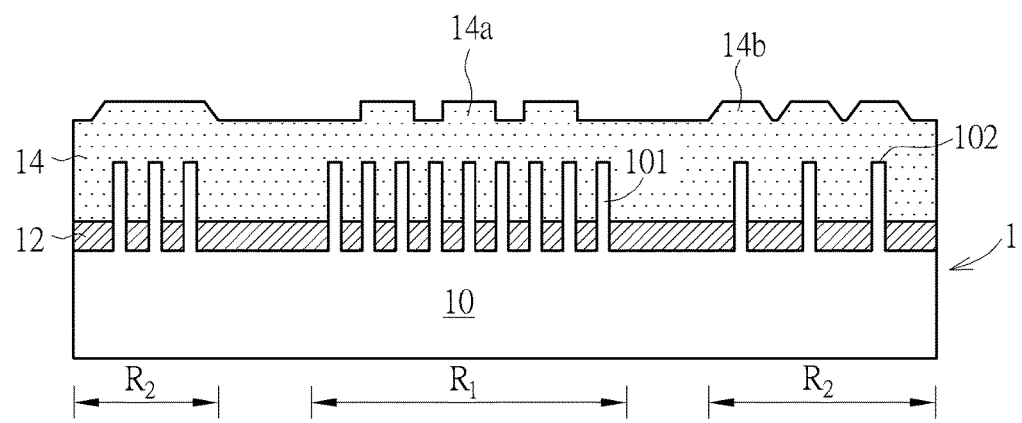

Subsequently, as shown in FIG. 10, the remaining mask layer 20 including the photoresist pattern 22 and the hard mask 21 is completely removed. At this point, the large bump 14a in the first region $R_1$ may be transformed into several small bumps.

Figure 11:
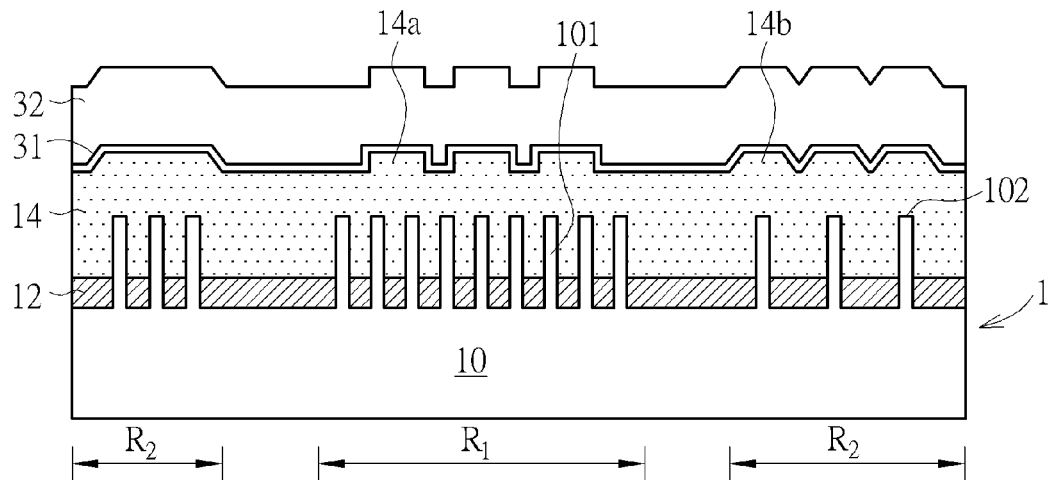

As shown in FIG. 11, after removing the mask layer 20, a polish stop layer 31 is conformally deposited on the major surface S of the material layer 14. According to the embodiment, the polish stop layer 31 may comprise silicon nitride, but is not limited thereto. Subsequently, a cap layer 32 is conformally deposited on the polish stop layer 31.

According to the embodiment, the cap layer 32 may comprise silicon oxide or amorphous silicon. According to the embodiment, the cap layer 32 may have a topography that is similar to that of the major surface S of the material layer 14.

Figure 12:
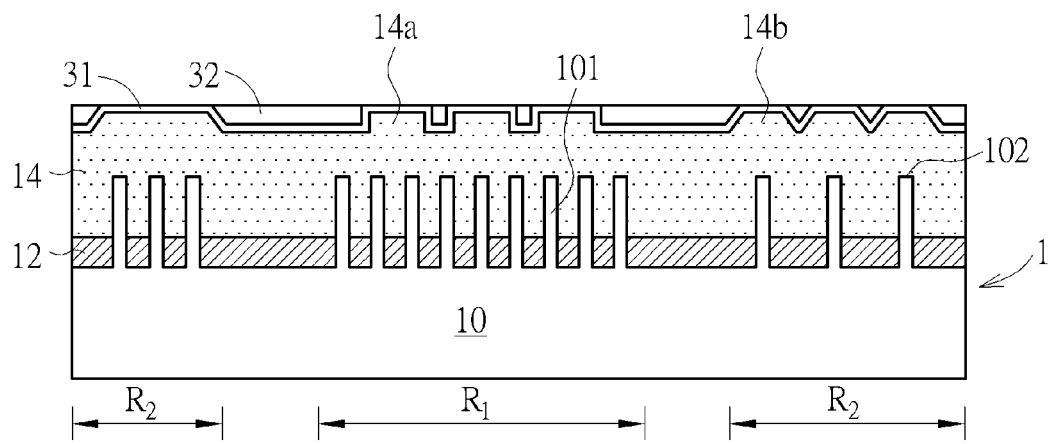

As shown in FIG. 12, after depositing the cap layer 32, a chemical mechanical polishing (CMP) process is performed to polish the cap layer 32. According to the embodiment, the CMP process stops on the polish stop layer 31. According to the embodiment, at the end point and upon the exposure of the polish stop layer 31, a portion of the cap layer 32 may remain on the polish stop layer 31.

Figure 13:
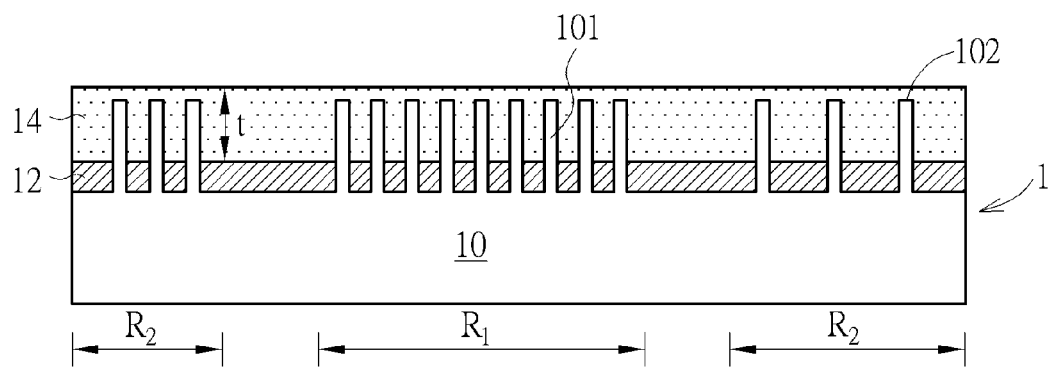

As shown in FIG. 13, a dry etching process is then performed to etch the remaining cap layer 32, the polishing stop layer 31, and the material layer 14 until a target thickness t of the material layer 14 is reached. According to the embodiment, the dry etching process is performed at a substantially same etching rate with respect to the cap layer 32, the polishing stop layer 31, and the material layer 14. According to the embodiment, after the dry etching process is completed, the material layer 14 has a flat major surface.

Please refer to FIG. 14 to FIG. 20. FIG. 14 to FIG. 20 are schematic, cross-sectional diagrams showing an exemplary method of planarizing a substrate surface in accordance with other embodiments of the invention, wherein like numeral numbers designate like layers, elements, or regions.

Figure 14:
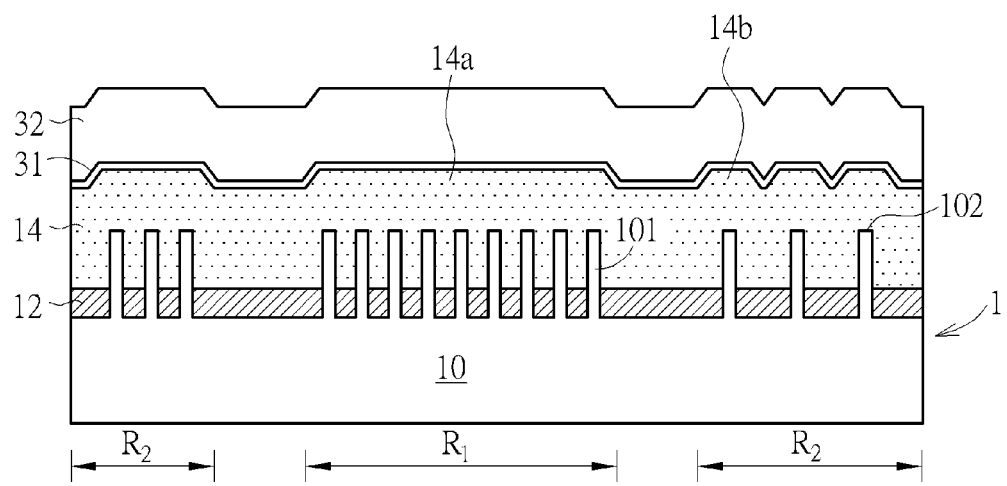
FIG. 14 to FIG. 20 are schematic, cross-sectional diagrams showing an exemplary method of planarizing a substrate surface in accordance with other embodiments of the invention.

As shown in FIG. 14, a substrate 1 is provided. The substrate 1 may comprise a semiconductor bulk layer 10 such as a silicon layer, a silicon substrate, or the like. An isolation layer 12 may be formed on or in the semiconductor bulk layer 10. For example, the isolation layer 12 may comprise shallow trench isolation (STI).

According to the embodiment, the substrate 1 may further comprise a plurality of fin structures 101 and 102, which may be integrally formed with the semiconductor bulk layer 10 and may protrude from a top surface of the isolation layer 12. According to the embodiment, the fin structures 101 are arranged in the first region $R_1$ and the fin structures 102 are arranged in the second region $R_2$. The first region $R_1$ and the second region $R_2$ may be two spaced-apart, non-overlapping regions.

According to the embodiment, the fin structures 101 are more densely packed than the fin structures 102. A material layer 14 such as an amorphous silicon layer may be deposited on the fin structures 101 and 102 and on the isolation layer 12.

The fin structures 101 and 102 are covered with the material layer 14. According to the embodiment, the material layer 14 has a major surface S with a topography including a large bump 14a in the first region $R_1$ and several small bumps 14b in the second region $R_2$.

A polish stop layer 31 is conformally deposited on the major surface S of the material layer 14. According to the embodiment, the polish stop layer 31 may comprise silicon nitride, but is not limited thereto. Subsequently, a cap layer 32 is conformally deposited on the polish stop layer 31. According to the embodiment, the cap layer 32 may comprise silicon oxide or amorphous silicon. According to the embodiment, the cap layer 32 may have a topography that is similar to that of the major surface S of the material layer 14.

According to the embodiment, the cap layer 32 has a relatively lower removal rate in the first region $R_1$ than that in the second region $R_2$ during a chemical mechanical polishing (CMP) process due to the topography of the major surface S and the pattern density of the fin structures 101 and 102.

Figure 15:
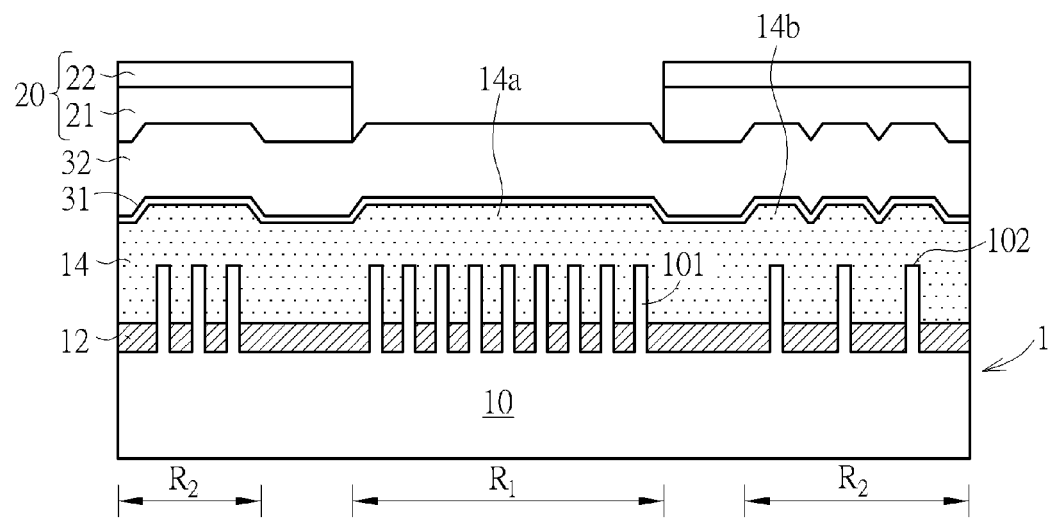

As shown in FIG. 15, a mask layer 20 including a hard mask 21 and a photoresist pattern 22 is formed on the top surface of the cap layer 32. An opening 200 is formed in the mask layer 20 to expose the cap layer 32 in the first region $R_1$. The second region $R_2$ is covered with the mask layer 20. Alternatively, as shown in FIG. 20, the top surface of the cap layer 32 may be partially exposed by a mask layer 20 having a plurality of openings 200a.

Figure 16:
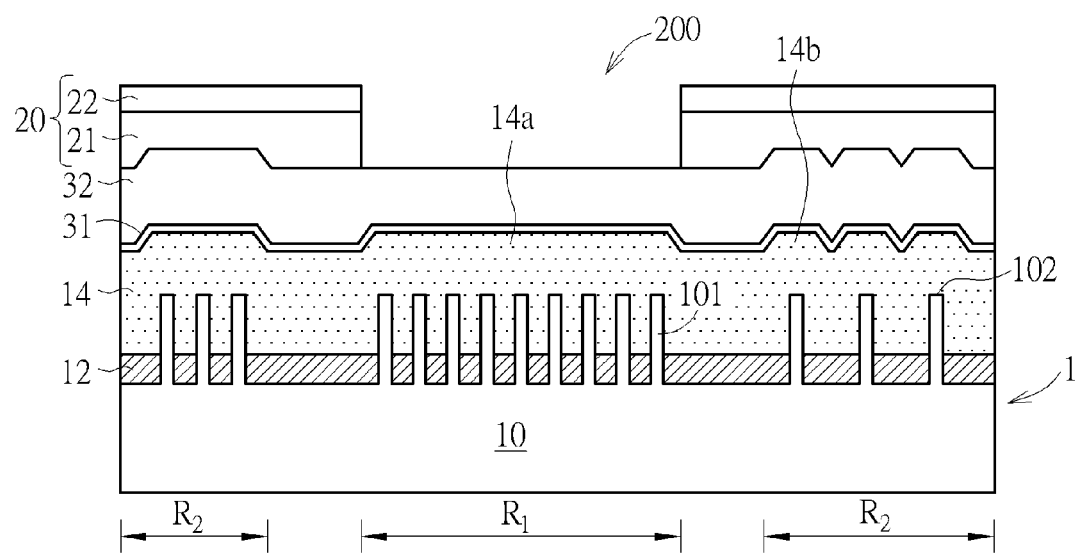
Figure 20:
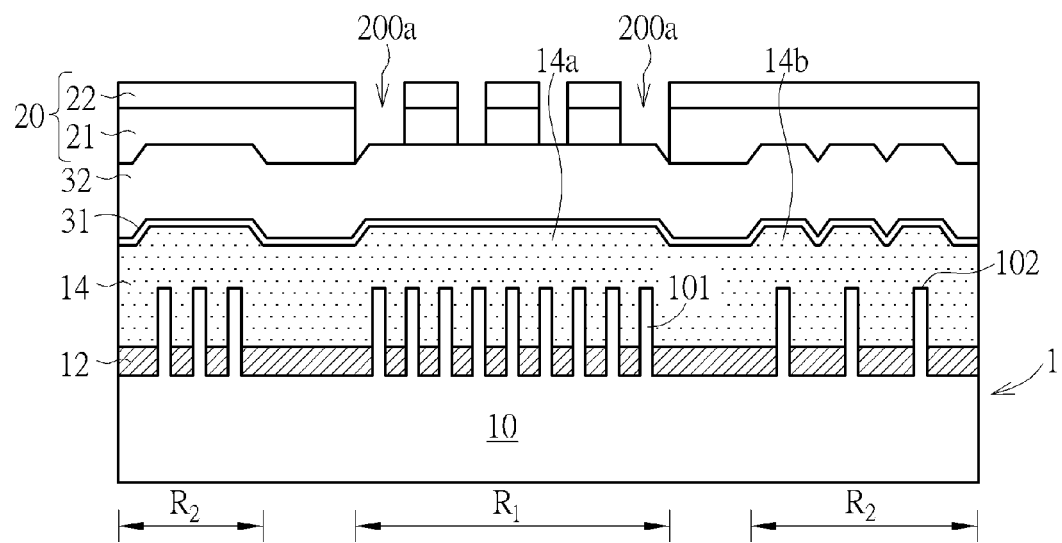

As shown in FIG. 16, using the photoresist pattern 22 and the hard mask 21 as an etching hard mask, an etching process is performed to remove at least a portion of the cap layer 32 from the opening 200 (or from the openings 200a as depicted in FIG. 20).

Figure 17:
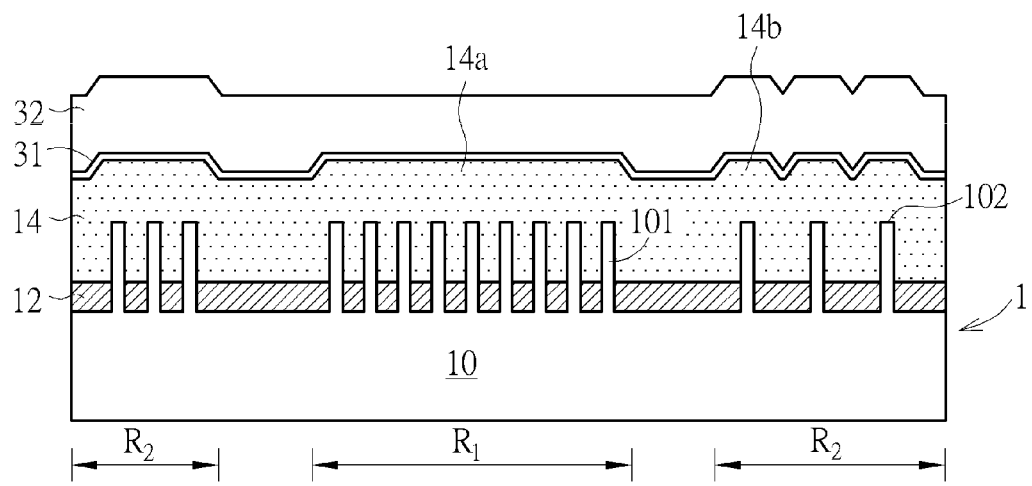

Subsequently, as shown in FIG. 17, the remaining mask layer 20 including the photoresist pattern 22 and the hard mask 21 is completely removed.

Figure 18:
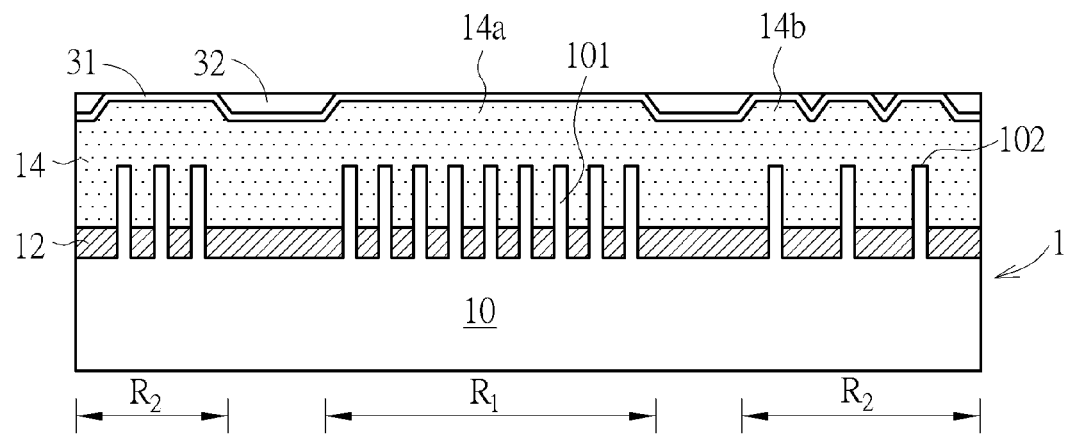

As shown in FIG. 18, a chemical mechanical polishing (CMP) process is performed to polish the cap layer 32. According to the embodiment, the CMP process stops on the polish stop layer 31. According to the embodiment, at the end point and upon the exposure of the polish stop layer 31, a portion of the cap layer 32 may remain on the polish stop layer 31.

Figure 19:
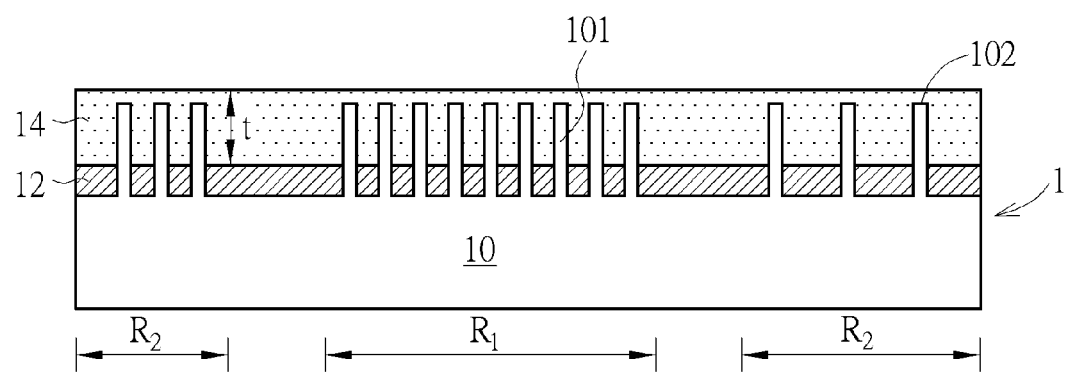

As shown in FIG. 19, a dry etching process is then performed to etch the remaining cap layer 32, the polishing stop layer 31, and the material layer 14 until a target thickness t of the material layer 14 is reached. According to the embodiment, the dry etching process is performed at a substantially same etching rate with respect to the cap layer 32, the polishing stop layer 31, and the material layer 14. According to the embodiment, after the dry etching process is completed, the material layer 14 has a flat major surface.

Please refer to FIG. 21 to FIG. 26. FIG. 21 to FIG. 26 are schematic, cross-sectional diagrams showing an exemplary method of planarizing a substrate surface in accordance with still another embodiment of the invention, wherein like numeral numbers designate like layers, elements, or regions.

Figure 21:
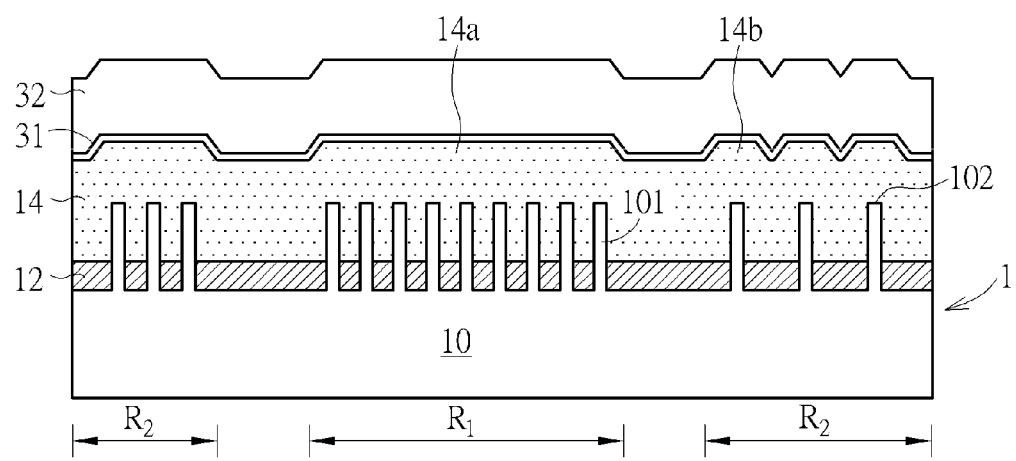
FIG. 21 to FIG. 26 are schematic, cross-sectional diagrams showing an exemplary method of planarizing a substrate surface in accordance with still another embodiment of the invention.

As shown in FIG. 21, likewise, a substrate 1 is provided. The substrate 1 may comprise a semiconductor bulk layer 10 such as a silicon layer, a silicon substrate, or the like. An isolation layer 12 may be formed on or in the semiconductor bulk layer 10. For example, the isolation layer 12 may comprise shallow trench isolation (STI).

According to the embodiment, the substrate 1 may further comprise a plurality of fin structures 101 and 102, which may be integrally formed with the semiconductor bulk layer 10 and may protrude from a top surface of the isolation layer 12. According to the embodiment, the fin structures 101 are arranged in the first region $R_1$ and the fin structures 102 are arranged in the second region $R_2$. The first region $R_1$ and the second region $R_2$ may be two spaced-apart, non-overlapping regions. In some embodiments, the first region $R_1$ may be contiguous with the second region $R_2$.

According to the embodiment, the fin structures 101 are more densely packed than the fin structures 102. A material layer 14 such as an amorphous silicon layer may be deposited on the fin structures 101 and 102 and on the isolation layer 12.

The fin structures 101 and 102 are covered with the material layer 14. According to the embodiment, the material layer 14 has a major surface S with a topography including a large bump 14a in the first region $R_1$ and several small bumps 14b in the second region $R_2$.

A polish stop layer 31 is conformally deposited on the major surface S of the material layer 14. According to the embodiment, the polish stop layer 31 may comprise silicon nitride, but is not limited thereto. Subsequently, a cap layer 32 is conformally deposited on the polish stop layer 31. According to the embodiment, the cap layer 32 may comprise silicon oxide or amorphous silicon. According to the embodiment, the cap layer 32 may have a topography that is similar to that of the major surface S of the material layer 14.

According to the embodiment, the cap layer 32 has a relatively lower removal rate in the first region $R_1$ than that in the second region $R_2$ during a chemical mechanical polishing (CMP) process due to the topography of the major surface S and the pattern density of the fin structures 101 and 102.

Figure 22:
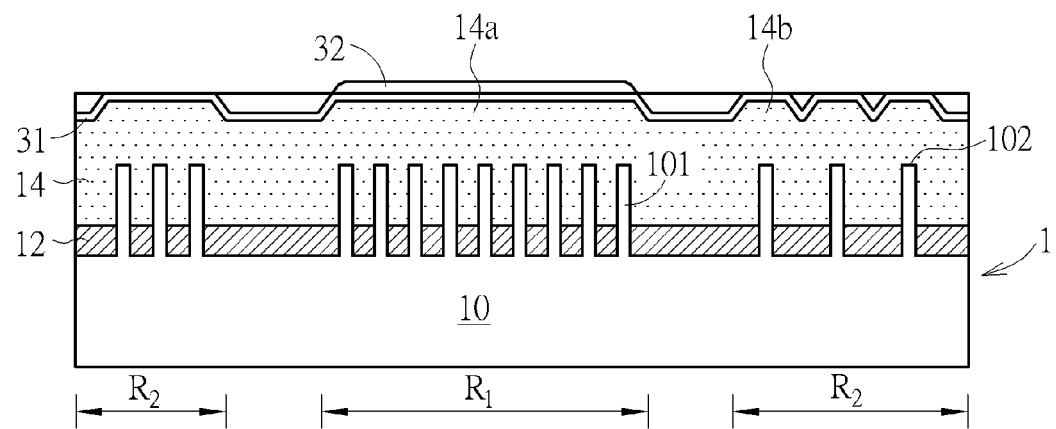

As shown in FIG. 22, after depositing the cap layer 32, a chemical mechanical polishing (CMP) process is performed to polish the cap layer 32. According to the embodiment, the CMP process stops on the polish stop layer 31. According to the embodiment, at the end point and upon the exposure of the polish stop layer 31, a portion of the cap layer 32 may remain on the polish stop layer 31.

Figure 23:
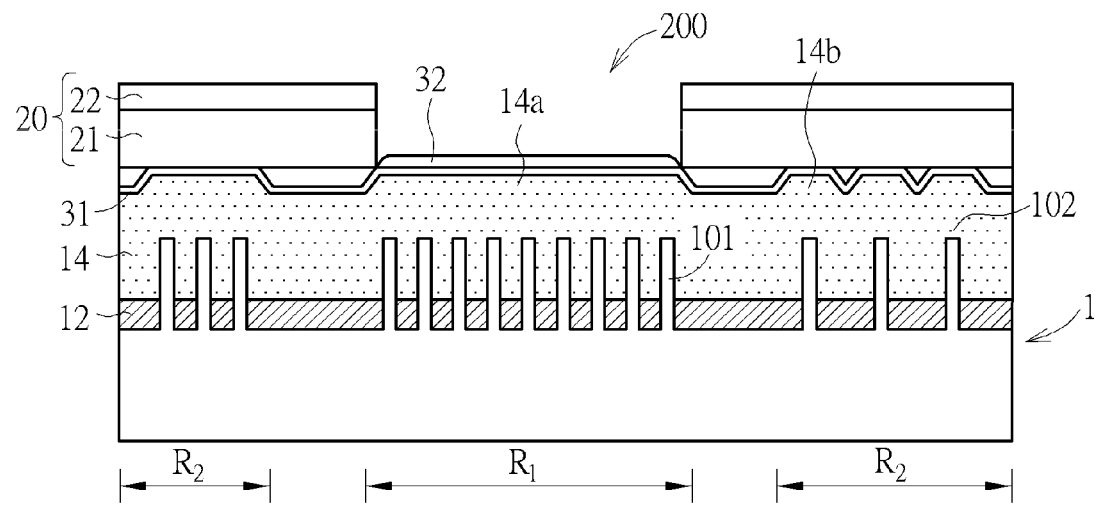

As shown in FIG. 23, a mask layer 20 including a hard mask 21 and a photoresist pattern 22 is formed on the top surface of the cap layer 32. An opening 200 is formed in the mask layer 20 to expose the cap layer 32 in the first region $R_1$. The second region $R_2$ is covered with the mask layer 20.

Figure 24:
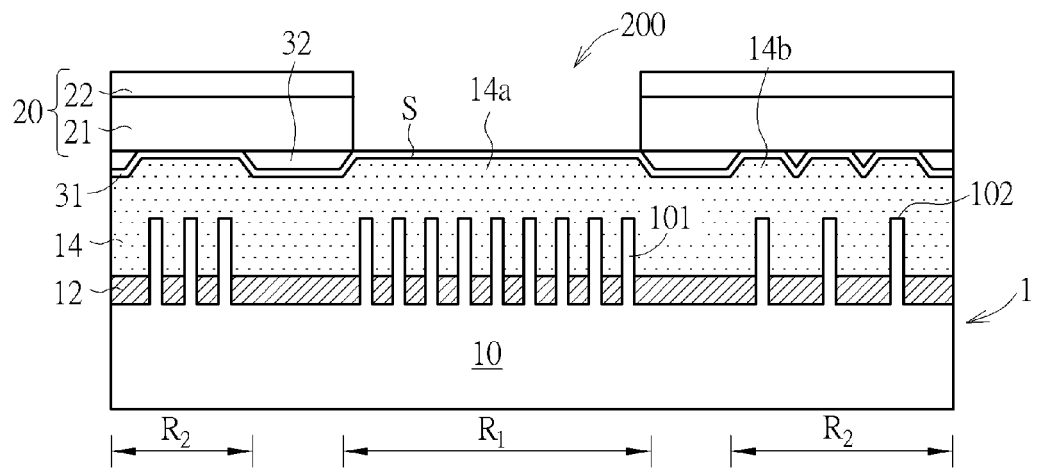

As shown in FIG. 24, using the photoresist pattern 22 and the hard mask 21 as an etching hard mask, an etching process is performed to remove at least a portion of the cap layer 32 from the opening 200.

Figure 25:
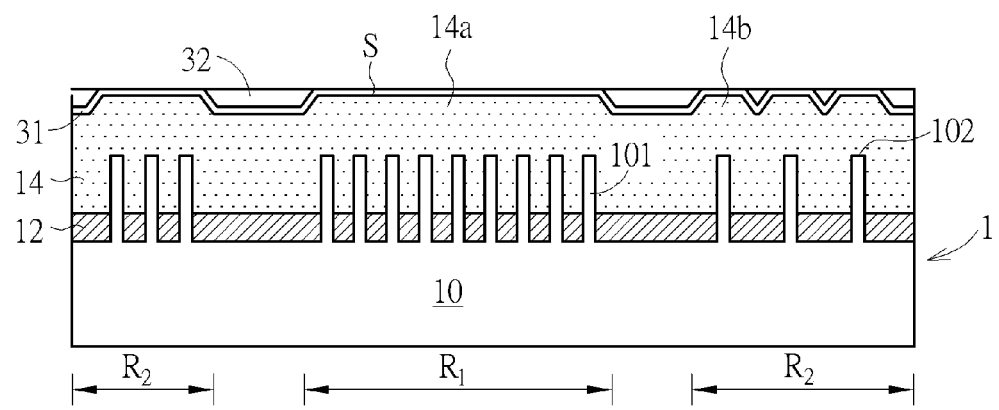

Subsequently, as shown in FIG. 25, the remaining mask layer 20 including the photoresist pattern 22 and the hard mask 21 is completely removed.

Figure 26:
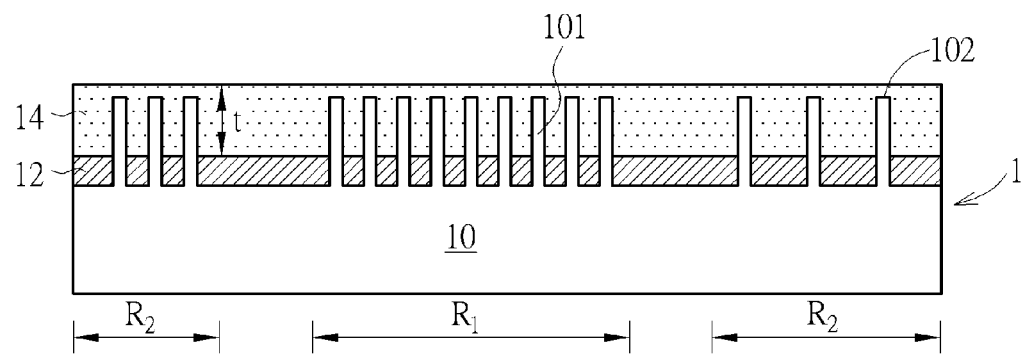

As shown in FIG. 26, a dry etching process is then performed to etch the remaining cap layer 32, the polishing stop layer 31, and the material layer 14 until a target thickness t of the material layer 14 is reached. According to the embodiment, the dry etching process is performed at a substantially same etching rate with respect to the cap layer 32, the polishing stop layer 31, and the material layer 14. According to the embodiment, after the dry etching process is completed, the material layer 14 has a flat major surface.

Please refer to FIG. 27 to FIG. 32. FIG. 27 to FIG. 32 are schematic, cross-sectional diagrams showing an exemplary method of planarizing a substrate surface in accordance with yet another embodiment of the invention, wherein like numeral numbers designate like layers, elements, or regions.

Figure 27:
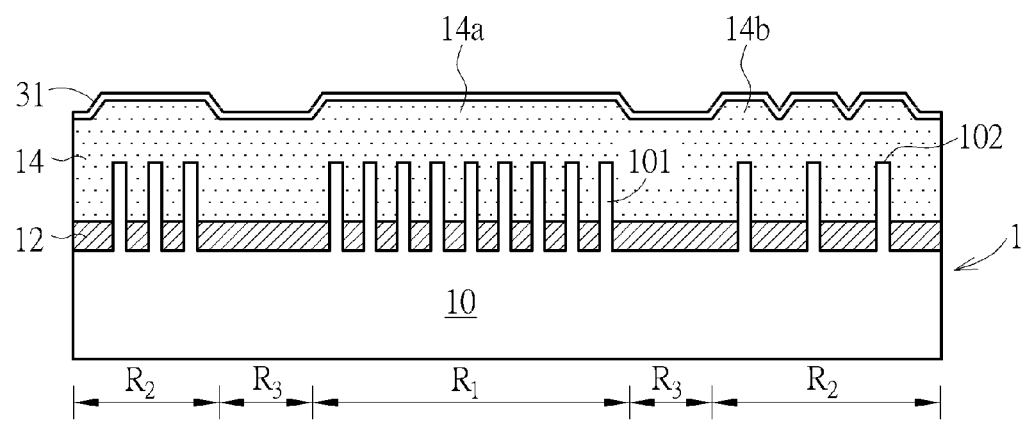
FIG. 27 to FIG. 32 are schematic, cross-sectional diagrams showing an exemplary method of planarizing a substrate surface in accordance with yet another embodiment of the invention.

As shown in FIG. 27, a substrate 1 is provided. The substrate 1 may comprise a semiconductor bulk layer 10 such as a silicon layer, a silicon substrate, or the like. An isolation layer 12 may be formed on or in the semiconductor bulk layer 10. For example, the isolation layer 12 may comprise shallow trench isolation (STI).

According to the embodiment, the substrate 1 may further comprise a plurality of fin structures 101 and 102, which may be integrally formed with the semiconductor bulk layer 10 and may protrude from a top surface of the isolation layer 12. According to the embodiment, the fin structures 101 are arranged in the first region $R_1$ and the fin structures 102 are arranged in the second region $R_2$. The first region $R_1$ and the second region $R_2$ may be two spaced-apart, non-overlapping regions.

A third region $R_3$ may be situated between the first region $R_1$ and the second region $R_2$. According to the embodiment, no fin structure is formed within the third region $R_3$. Atop surface of the third region $R_3$ is lower than that of either the first region $R_1$ or the second region $R_2$.

According to the embodiment, the fin structures 101 are more densely packed than the fin structures 102. A material layer 14 such as an amorphous silicon layer may be deposited on the fin structures 101 and 102 and on the isolation layer 12.

The fin structures 101 and 102 are covered with the material layer 14. According to the embodiment, the material layer 14 has a major surface S with a topography including a large bump 14a in the first region $R_1$ and several small bumps 14b in the second region $R_2$.

A polish stop layer 31 is conformally deposited on the major surface S of the material layer 14. According to the embodiment, the polish stop layer 31 may comprise silicon nitride, but is not limited thereto.

Figure 28:
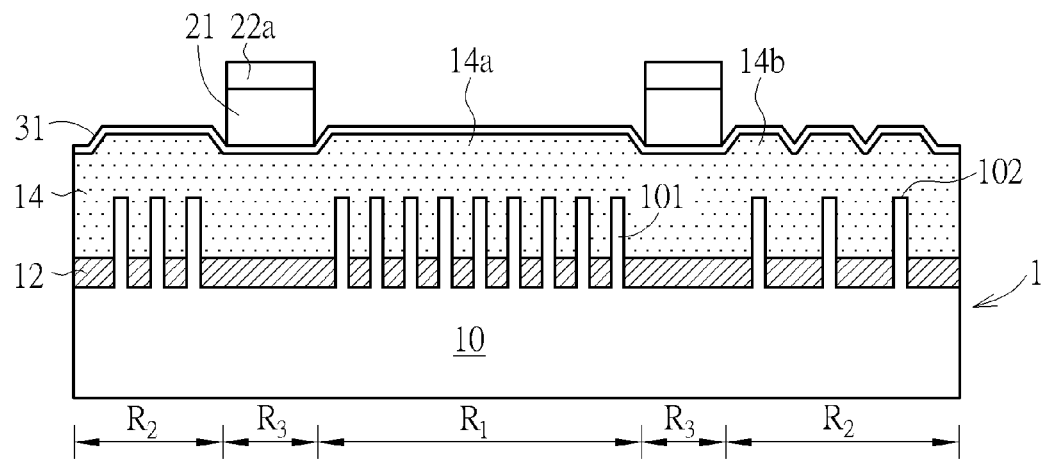

As shown in FIG. 28, a mask layer 20 including a hard mask 21 and a photoresist pattern 22 is formed on the top surface of the polish stop layer 31 only within the third region $R_3$. The polish stop layer 31 is exposed in the first region $R_1$ and in the second region $R_2$.

Figure 29:
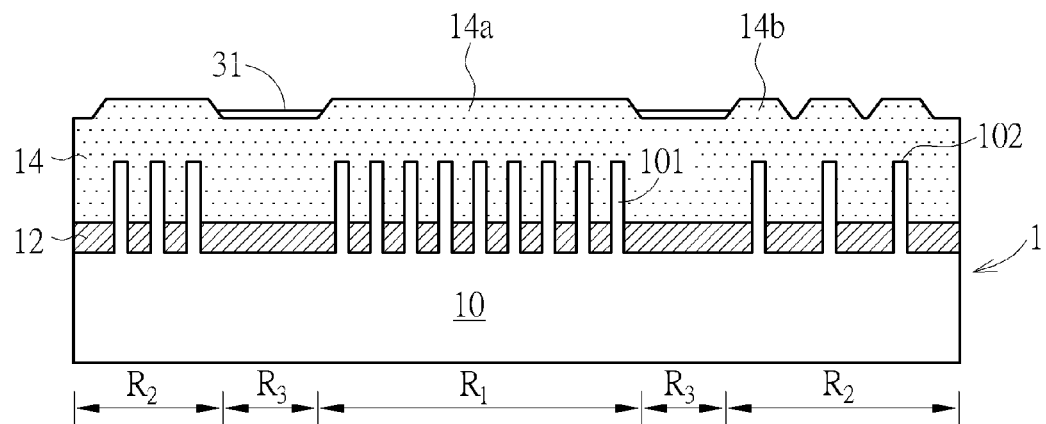

As shown in FIG. 29, using the photoresist pattern 22 and the hard mask 21 as an etching hard mask, an etching process is performed to remove at least a portion of the cap layer 32 from the first region $R_1$ and the second region $R_2$.

The remaining mask layer 20 is then removed, leaving the polish stop layer 31 in the third region R₃ intact.

Figure 30:
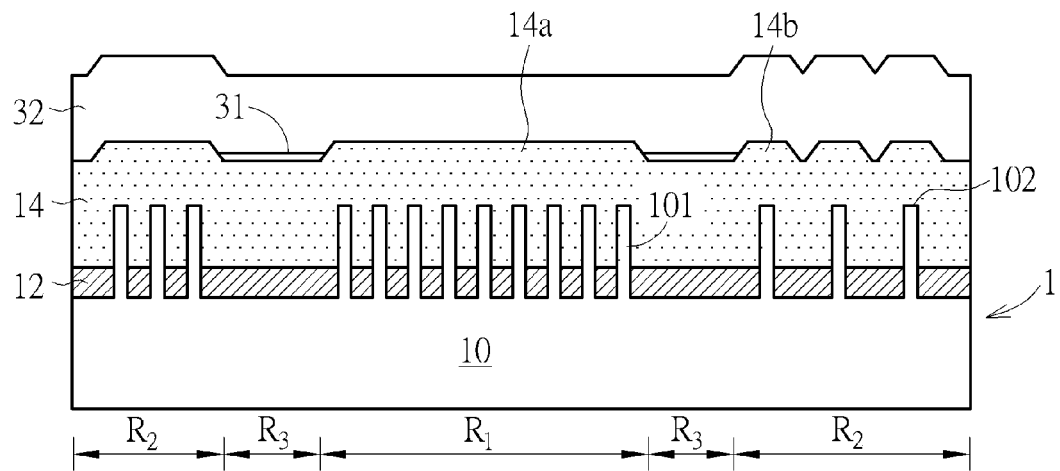

Subsequently, as shown in FIG. 30, a cap layer 32 is conformally deposited on the polish stop layer 31. According to the embodiment, the cap layer 32 may comprise silicon oxide or amorphous silicon. According to the embodiment, the cap layer 32 may have a topography that is similar to that of the major surface S of the material layer 14.

According to the embodiment, the cap layer 32 has a relatively lower removal rate in the first region R₁ than that in the second region R₂ during a chemical mechanical polishing (CMP) process due to the topography of the major surface S and the pattern density of the fin structures 101 and 102. According to the embodiment, the removal rate of the cap layer 32 in the third region R₃ is faster than that of the first region R₁ or the second region R₂.

Figure 31:
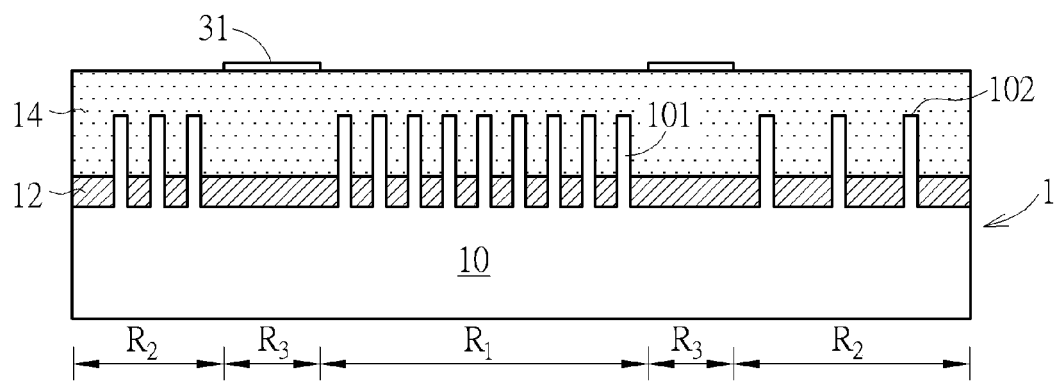

As shown in FIG. 31, after depositing the cap layer 32, a chemical mechanical polishing (CMP) process is performed to polish the cap layer 32. According to the embodiment, the CMP process stops on the polish stop layer 31.

Figure 32:
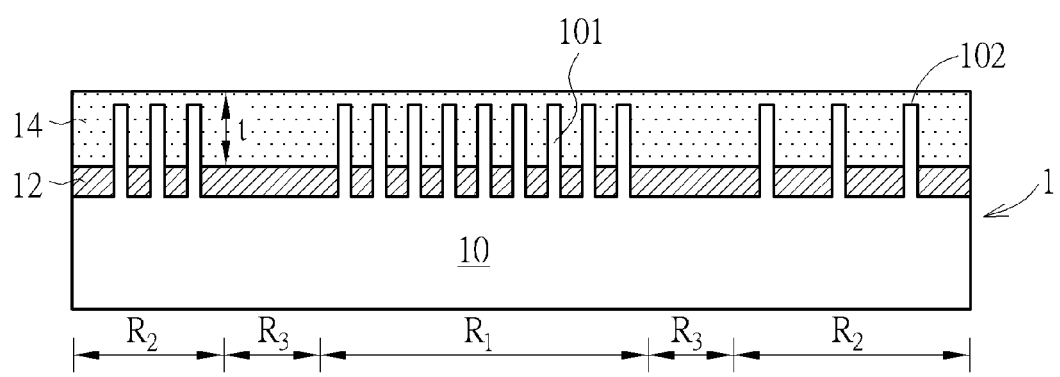

As shown in FIG. 32, a dry etching process is then performed to etch the remaining polishing stop layer 31 and the material layer 14 until a target thickness t of the material layer 14 is reached. According to the embodiment, the dry etching process is performed at a substantially same etching rate with respect to the polishing stop layer 31 and the material layer 14. According to the embodiment, after the dry etching process is completed, the material layer 14 has a flat major surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of planarizing a substrate surface, comprising:
    providing a substrate having a major surface of a material layer, wherein the major surface of the material layer comprises a first region with relatively low removal rate and a second region of relatively high removal rate;
    depositing a polish stop layer on the major surface of the material layer;
    forming a photoresist pattern on the polish stop layer, wherein the photoresist pattern masks the second region of relatively high removal rate, while exposes at least a portion of the first region with relatively low removal rate;
    etching away at least a portion of the polish stop layer not covered by the photoresist pattern; and
    removing the photoresist pattern.

2. The method according to claim 1, wherein after removing the photoresist pattern, the method further comprises:
    depositing a cap layer on the polish stop layer and on the material layer; and
    performing a chemical mechanical polishing (CMP) process to polish the cap layer.

3. The method according to claim 2, wherein the material layer comprises amorphous silicon.

4. The method according to claim 2, wherein the CMP process stops on the polish stop layer.

5. The method according to claim 4, wherein the polish stop layer comprises silicon nitride, and wherein the cap layer comprises silicon oxide or amorphous silicon.

6. The method according to claim 2, wherein after performing the CMP process to polish the cap layer and the material layer, the method further comprises:
    performing a dry etching process to etch the polishing stop layer and the material layer.

* * * * *